United States Patent [19]

Bobick

[11] 4,103,252

[45] Jul. 25, 1978

[54] CAPACITIVE TOUCH-ACTIVATED TRANSDUCER SYSTEM INCLUDING A PLURALITY OF OSCILLATORS

[75] Inventor: Thomas W. Bobick, Richardson, Tex.

[73] Assignee: Xerox Corporation, Stamford, Conn.

[21] Appl. No.: 744,907

[22] Filed: Nov. 26, 1976

[51] Int. Cl.² .................. Q01D 21/04; H01G 7/00; H03K 3/72

[52] U.S. Cl. ............................ 331/48; 200/52 R; 200/DIG. 1; 307/116; 331/55; 331/56; 331/65; 331/108 D; 331/111; 340/365 R; 361/280; 340/562

[58] Field of Search ............... 331/65, 108 D, 111, 331/48, 55, 56; 307/116; 328/1, 5; 324/61 R, 61 P; 340/200, 258 C, 324 A, 324 AD, 365 R; 361/181, 203, 280; 200/52 R, DIG. 1, DIG. 2

[56] References Cited

U.S. PATENT DOCUMENTS

| 2,219,497 | 10/1940 | Stevens et al. | 324/61 R |
|---|---|---|---|
| 2,546,307 | 3/1951 | Johnson et al. | 331/65 X |
| 3,497,617 | 2/1970 | Ellis | 178/19 |
| 3,582,827 | 6/1971 | Bjerede | 331/65 X |
| 3,737,670 | 6/1973 | Larson | 307/116 |
| 3,751,612 | 8/1973 | Hansen | 200/52 R |
| 3,773,989 | 11/1973 | Hacon | 200/52 R |
| 4,001,807 | 1/1977 | Dallimonti | 340/324 A |

Primary Examiner—Siegfried H. Grimm

[57] ABSTRACT

A human touch on an etched copper electrode produces a capacitive change to vary the time constant of an RC network as a part of an oscillator. The variation in the capacitance of the sensor changes the time constant of the RC network which results in a change in frequency of the output signal of the oscillator. This change in frequency thus varies with the human touch to the copper electrode. To develop a directional indication of the touch position, four electrodes are arranged in opposed pairs along orthogonal axes. Each electrode is part of an RC network connected to an oscillator with each of the four oscillators identified with one of the four positions along the orthogonal axes. The output signal from each of the oscillators is transmitted to timing and control circuitry that generates four separate pulse trains, one pulse train identified with each of four positions along the orthogonal axis.

19 Claims, 9 Drawing Figures

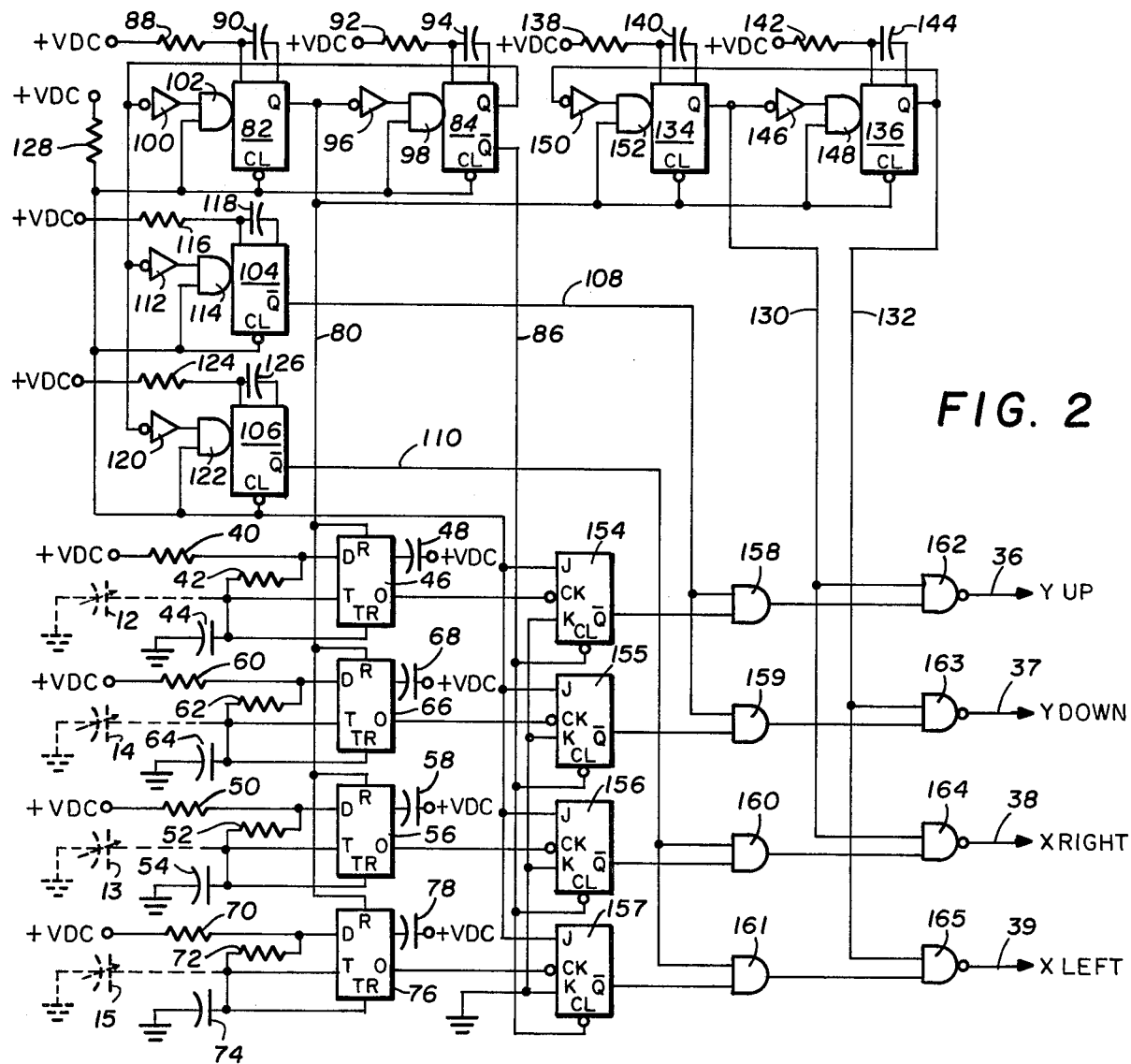
FIG. 2
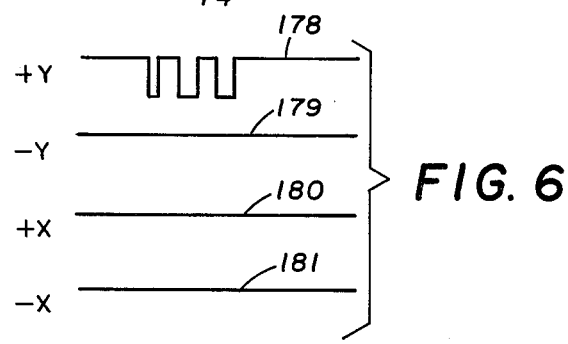
FIG. 6
FIG. 7
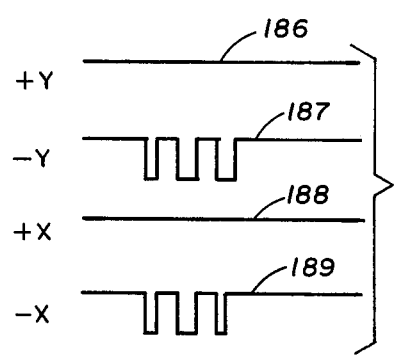
FIG. 8
FIG. 9

CAPACITIVE TOUCH-ACTIVATED TRANSDUCER SYSTEM INCLUDING A PLURALITY OF OSCILLATORS

BACKGROUND OF THE INVENTION

This invention relates to a capacitive activated transducer, and more particularly to a transducer sensitive to human touch for generating a change in frequency of an oscillator output.

Automatic data processing systems of the computer controller type, and in particular data word processing systems, require directive and corrective instructions from an operator to achieve efficient and satisfactory operation. With such systems, it is important to reduce operator reaction time to a minimum which makes necessary a communication link between the operator and the system, and vice versa, that is simple and reliable. Further, any system for presenting information to and receiving instructions from an operator should be rapid and easily interpreted.

Recently, there has been a general acceptance of a technique utilizing a means for displaying data for rapid and easy communication to an operator and, of course, this is usually provided by the cathode ray tube (CRT), which may be controlled to display data on a screen. Such data is often presented in a line format comprising numerical and alphabetic characters and other symbols, and the items of information, comprising individual symbols or combination of symbols, appear on the screen of the cathode ray tube in much the same manner as presented on a page of typed script. Thus, the cathode ray tube provides a convenient and satisfactory communication link between the data processing system and the operator.

The communication link is not so satisfactory between an operator and the system, particularly in the case of accepting instructions from the operator. The operator may need to perform a processing function with respect to any of the data displayed on the CRT screen. For example, a particular character or set of characters may require deletion and substitution with other characters. Also, one entire area of the display may need to be rearranged with other data in the system. To perform this function it is necessary to make available to the operator a communication link that enables identification of the character or characters in terms of its location on the screen of the cathode ray tube.

Heretofore, there have been many efforts made to enable an operator of a data processing system to identify a particular character or area of characters displayed on the screen of a cathode ray tube. In one such prior art system, a so-called touch wire overlay mask is mounted upon the screen of the cathode ray tube and connected to suitable response devices that enables the item identification function to be performed by the operator applying a finger touch to the appropriate region of the mask. The response devices connected to the touch wire overlay mask require extensive and complex circuitry, but most important have not been as reliable as desired. Other attempts to establish a communication link between an operator and a data display have utilized light grids in an attempt to locate where an operator's finger is placed by interrupting the circuit of a photosensitive device. Still another approach found in the prior art to solve the problem of operator communication utilizes one or more capacitors which are integrally associated with the screen of the cathode ray tube and are intentionally of a high leakage character. When the leakage field is interrupted by an operator's finger touch, the capacitive reactance is changed and a bridge circuit balance is upset.

SUMMARY OF THE INVENTION

In accordance with the present invention, a sensor for a capacitive activated transducer includes a first pair of opposed electrodes positioned along one or two orthogonal axes, and a second pair of opposed electrodes positioned along the second of the orthogonal axes.

A capacitive activated transducer in accordance with the present invention includes a sensor responsive to a position touch to generate a change in capacitance. An oscillator connected to said sensor generates a signal at a frequency related to the capacitance of the sensor, which may be of the opposed electrode pair as previously described.

BRIEF DESCRIPTION OF THE DRAWINGS

A more complete understanding of the invention and its advantages may best be understood by reference to the following description taken in conjunction with the accompanying drawings.

Referring to the drawings:

FIG. 2 is a logic diagram of oscillator and timing control circuitry responsive to a touch sensitive sensor;

FIGS. 6 through 9 are a sequence of waveform outputs for each of the four channels of the circuit of FIG. 2 for various touch positions of the sensor of FIG. 1.

DESCRIPTION OF THE PREFERRED EMBODIMENT

Figure 1:
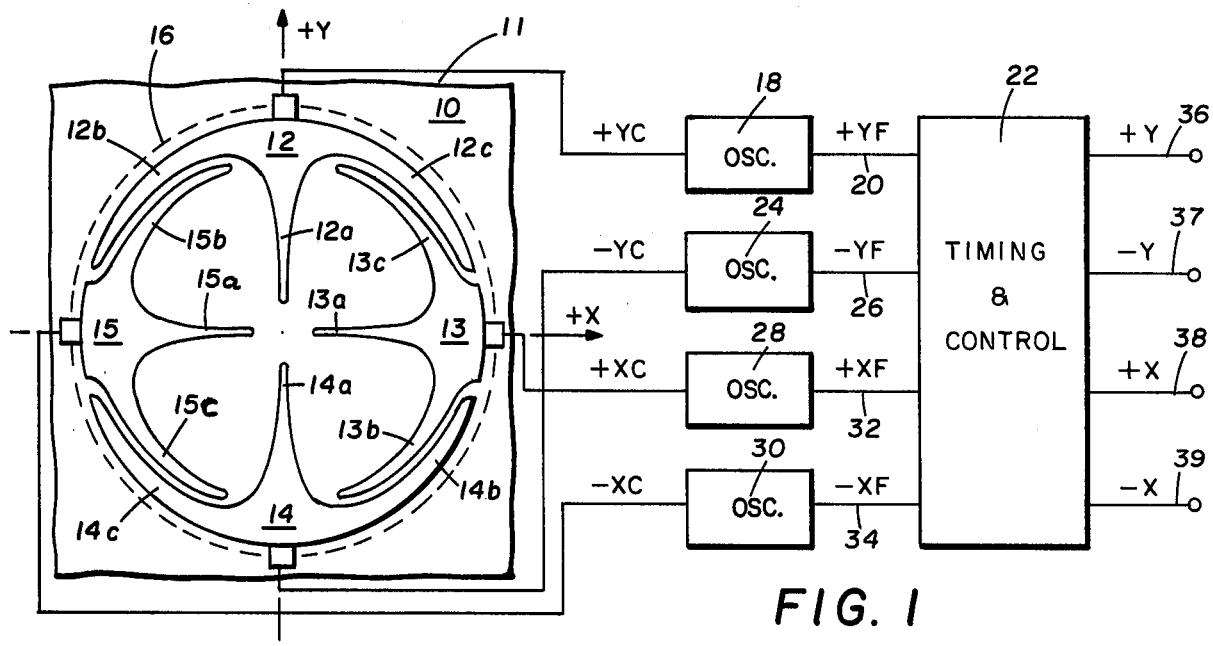
FIG. 1 is a schematic and block diagram of a touch sensitive capacitive activated transducer.

Referring to FIG. 1, there is shown a capacitive activated transducer 10 consisting of four isolated etched copper electrodes 12 through 15 typically formed on a laminate substrate 11 by a conventional etching technique. Overlying the electrodes 12 through 15 is a transparent plastic shield 16 through which the electrodes 12-15 are visible. The transparent plastic shield 16 forms a protective layer for the electrodes 12-15 from direct contact by human touch.

Each of the electrodes 12-15 includes a radially inwardly extending finger 12a-15a, respectively, that terminates near the intersection of the X-axis and Y-axis of the transducer. The particular pattern for each of the electrodes 12 through 15 further includes curved sections 12b and 12c, 13b and 13c, 14b and 14c, and 15b and 15c, respectively, curving from the respective X or Y-axis on which the electrode is oriented. Each of the curved sections of an electrode tapers slightly from the central intersection with the radially extending finger to a point near the orthogonal axis on which the electrode is located.

As designed, the interdigitated spacing between the curved sections of each of the electrodes is substantially constant between juxtapositioned sections. For example, the spacing between the sections 12b and 15b is substantially constant throughout the overlapping area of these two sections.

While other configurations of the transducer 10 are considered possible within the scope of the present invention, the particular pattern illustrated allows a change in capacitance to be sensed along two axes simultaneously.

One application of the transducer 10 is as a sensor for a cursor display control system for use with a cathode ray tube display as utilized in data processing machines, such as a word processing machine. When an operator's finger is placed on any part of the copper pattern of the transducer 10, the human touch causes a change in capacitance that is sensed to change the frequency of an oscillator generating a pulse stream as a signal to indicate a desired position or motion of the cathode ray tube display.

The electrode 12 of the transducer 10 is connected to the input of an oscillator 18 that generates a frequency varying with the capacitance of the electrode 12 on a line 20 as one input to a timing and control network 22. Electrode 14 is connected to the input of an oscillator 24 that generates a frequency signal on a line 26 at a rate dependent upon the capacitance of the electrode, also input to the timing and control network 22. Similarly, the electrode 13 is connected to the input of oscillator 28 and the electrode 15 is connected to an input of an oscillator 30.

Each of these oscillators generates a frequency signal on lines 20, 26, 32 and 34, respectively, to the timing and control network 22. Through operation of the timing and control network 22, four output pulse trains are generated on lines 36–39 that individually or in combination indicate the touch position of an operator's finger on the etched copper pattern of the transducer 10.

With the transducer 10 connected to the oscillators 18, 24, 28 and 30 and the timing and control network 22 as illustrated, the electrodes 12 and 14 detect a touch position along the Y-axis (up/down on a cathode ray tube) while the electrodes 13 and 15 respond to a touch to generate pulse trains from the timing and control network 22 to position a cursor on the X-axis (left/right on a cathode ray tube). The variation in electrode width of the transducer 10 allows the capacitance at any touch position on the etched copper pattern to vary with touch, thereby allowing a variation in the pulse train rate generated on the lines 36–39 from the timing and control network 22. As an example, the touch of an operator's finger at the midpoint of the finger 12a, either on or through the shield 16, will cause a pulse train to be generated on the line 36 which when coupled to a display cursor circuit of a cathode ray tube (CRT) will cause the cursor to move slowly up, while a touch at the electrode intersection of the finger 12a and the sections 12b and 12c will generate a pulse train on the line 36 to cause a display cursor to move rapidly upward. Likewise, a human touch of the finger 13a, or through the shield 16, will cause a pulse train to be generated on the line 38 which when coupled to a cursor circuit of a CRT will cause the displayed cursor to move slowly to the right while a human touch at the intersection of the finger 13a and the sections 13b and 13c will cause the display cursor to move rapidly to the right.

To develop a display cursor motion in a direction other than along the orthogonal axis an operator touches the plastic shield 16 at a point on the etched copper pattern such as the overlapping area between the sections 14c and 15c. A human touch at a point where the two sections 14c and 15c overlap causes pulse trains to be generated on the lines 37 and 39 simultaneously, which when coupled together in a cursor display circuit causes the display cursor to move down and to the left on a cathode ray tube.

Referring to FIG. 2, there is shown a detailed logic schematic of the oscillators and the timing control network 22 of FIG. 1 where each of the electrodes 12–15 is illustrated by a like numbered variable capacitor 12–15. Each of the variable capacitors 12–15 is part of a timing circuit as a part of the input to an oscillator. Specifically, the variable capacitor 12 is part of a timing circuit including resistors 40, 42 and a capacitor 44. The timing circuit is connected to the input of a "555" integrated circuit timer 46 that is also connected to the positive terminal of a DC voltage supply (not shown) through a capacitor 48. Specifically, the interconnection of the resistors 40 and 42 is tied to the D(Discharge) terminal of the timer 46 while the interconnection of the resistor 42 and the capacitor 44 is tied to the T(Trigger) and TR (Threshold) terminals of the timer. Similarly, the variable capacitor 13 is part of a timing circuit including resistors 50, 52 and a capacitor 54 interconnected to a "555" timer 56 with the timer connected to the positive terminal of a DC voltage supply through a capacitor 58. In like manner, the variable capacitor 14 is part of a timing circuit including resistors 60, 62 and a capacitor 64 connected to input terminals of a "555" timer 66 that is also connected through a capacitor 68 to the positive terminal of a DC voltage supply. The variable capacitor 15 is part of a timing circuit including resistors 70, 72 and a capacitor 74 tied to a "555" timer 76 that is also connected through a capacitor 78 to the positive terminal of a DC voltage supply. As illustrated, each of the timing circuits is also connected to the positive terminal of a DC voltage supply.

Each of the "555" timers is externally interconnected as a resettable free running oscillator with a reset pulse common to all oscillators generated on a line 80 applied to the R(Reset) terminal of each timer.

A human touch to any of the electrodes 12–15 causes the effective capacitance connected to each of the timers to increase thereby changing the pulse rate output at the O(Output) terminal of each timer. For example, a human touch of the variable capacitor 12 causes the effective capacitance at the interconnection of the resistor 42 and the capacitor 44 to increase. This increase in capacitance is sensed by the 555 timer 46 and the output frequency of the timer decreases.

Figure 3:
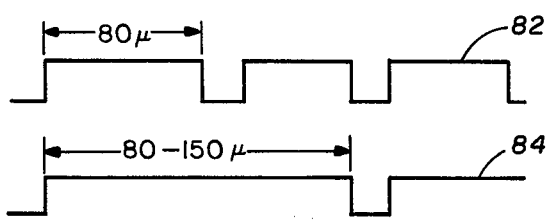
FIG. 3 is a two waveform representation of the output of an oscillator connected to an untouched sensor and a touched sensor.

Referring to FIG. 3, the waveform 82 is typical of the output of the timer 46 after initial power-on when the variable capacitor 12 is untouched. As illustrated, for the untouched condition of the variable capacitor 12, the pulse width at the output of the timer 46 is typically about 80 microseconds with the extra length of the first pulse resulting from the capacitance associated with the "555" timer initially charging from zero (0) volts toward +VDC and thereafter charging and discharging between $\frac{2}{3}$ +VDC and $\frac{1}{3}$ +VDC. Depending on the position of the touch of the variable capacitor 12, the pulse width output of the timer 46 increases from about 80 microseconds up to about 150 microseconds as shown by the waveform 84. It is this time difference, or increase in pulse width, that is sensed as a measure of the touch position over the etched copper pattern of the transducer 10.

Each of the other three channels, individually including the 555 timers 56, 66 and 76 operates in a similar manner. A touch of any of the electrodes 13–15 results in an increase in the pulse width at the output of each of the timers 56, 66 or 76, respectively. It is the time difference or pulse width increase at the output of the timers 46, 56, 66 and 76 that is applied to the timing and control network 22 to generate a pulse train on one or more of the output lines 36–39.

To establish the timing interval during which a pulse train is generated on any of the output lines an oscillator, comprising one-shots 82 and 84, generates clock pulses on lines 80 and 86. The oscillator consisting of the one-shots 82 and 84 also includes a timing network of a resistor 88 and a capacitor 90 connected to the one-shot 82 and a timing network of a resistor 92 and a capacitor 94 connected to the one-shot 84. The interconnection between the one-shot 82 and the one-shot 84 is by means of an inverter 96 and a NAND gate 98, which are internal to one-shot 84. A feedback loop from the Q-terminal of the one-shot 84 to the input of the one-shot 82 includes an inverter 100 and a NAND gate 102, which are internal to one-shot 82.

Based on the time constant of the timing networks, a pulse train of a given frequency, for example 30 Hz., is generated on line 80 and a pulse train of the same frequency is generated on the line 86.

Also included as part of the oscillator are one-shots 104 and 106 where the former generates output disable pulses on a line 108 and the latter generates output disable pulses on the line 110. Each of the one-shots 104 and 106 is connected to the Q-terminal of the one-shot 84. Specifically, the one-shot 104 receives the output of the one-shot 84 through an inverter 112 and a NAND gate 114, which are internal to 104. A timing network connected to the one-shot 104 includes a resistor 116 and a capacitor 118. Similarly, the one-shot 106 receives an output from the one-shot 84 through an inverter 120 and a NAND gate 122, which are internal to 106. The timing network for one-shot 106 consists of a resistor 124 and a capacitor 126. Each of the one-shots 82, 84, 104, and 106 has the CL terminal connected to a resistor 128 that is connected to the positive terminal of a DC voltage supply. Also interconnected to the resistor 28 is one input of each of the NAND gates 98, 102, 114 and 122.

Additional control pulses for the timing and control network 22 are generated on lines 130 and 132 as outputs from a pulse train oscillator. This pulse train oscillator consists of one-shots 134 and 136 in a circuit configuration similar to the one-shots 82 and 84. A timing network including a resistor 138 and a capacitor 140 is connected to the one-shot 134 and a timing network including a resistor 142 and a capacitor 144 is connected to the one-shot 136. The two one-shots are interconnected by an inverter 146 having an output applied to a NAND gate 148, which are internal to 136. In the feedback loop between the output of the one-shot 136 and the input of one-shot 134 there is provided an inverter 150 and a NAND gate 152, which are internal to 134. The pulse train oscillator is synchronized with the output of the one-shot 82 by an interconnection from the CL terminal of the one-shots 134 and 136 to the output line 80. Also tied to line 80 are the NAND gates 148 and 152.

Clock pulses on the lines 80, 86, 130 and 132 are utilized to control the 555 timers 46, 56, 66 and 76 and gating logic including J-K flip-flops 154–157 and various enable and disable AND gates 158–161 and NAND gates 162–165. As mentioned previously, clock pulses on the line 80 are applied to the reset terminals of the timers 46, 56, 66 and 76. Clock pulses on the line 86 are used to clear the J-K flip-flops 154–157 and are applied to the CL terminal of each of these flip-flops. Output disable pulses generated on the line 108 are applied to one terminal of the AND gates 158 and 159 where output disable pulses generated on the line 110 are applied to the AND gates 160 and 161. The clock pulses generated on the line 130 control the enabling of the NAND gates 162 and 164 and clock pulses on the line 132 are used to enable the NAND gates 163 and 165.

The interconnection and operation of the 555 timer, the J-K flip-flop, and the two gates in each channel is similar. Considering the Y-up channel, the varying frequency signal at the O-terminal of the 555 timer 46 is applied to the clock terminal of the J-K flip-flop 154 having the Q-terminal interconnected to one input of the AND gate 158. An output of the AND gate 158 is applied to one input of the NAND gate 162 having an output connected to the line 36. For the variable capacitor 13, an output of the timer 56 at the Q-terminal is applied to the clock input of the J-K flip-flop 156 having a Q-terminal interconnected to one input of the AND gate 160. The AND gate 160 has an output terminal interconnected to the NAND gate 164 having an output applied to the line 38. Similarly, the O-terminal of the 555 timer 66 is connected to the clock terminal on the J-K flip-flop 155 that generates an output of the Q-terminal applied to one input of the AND gate 159. The AND gate 159 provides output pulses that are applied to an input of the NAND gate 163 that is connected to the output line 37. In the channel including the variable capacitor 15, the timer 76 connects to the J-K flip-flop 157 having a Q-terminal connected to a AND gate 161. Connected to the output of the AND gate 161 is an input of the NAND gate 165 having an output tied to the line 39.

Each of the J-terminals of the flip-flops 154, 155, 156 and 157 is interconnected to the positive DC voltage through the resistor 128 and each of the K-terminals of these flip-flops is tied to ground.

Figure 4:
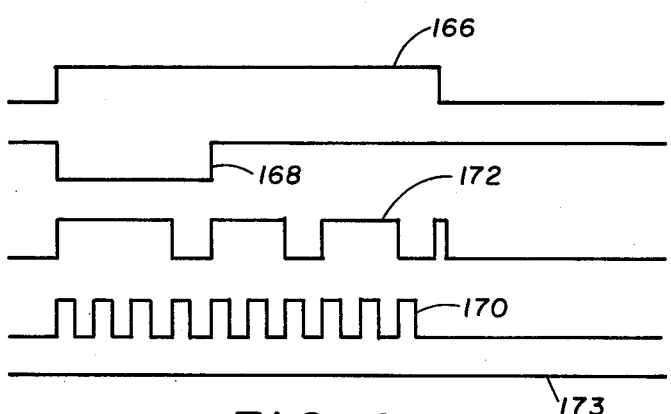
FIG. 4 is a series of waveforms illustrating the timing and control signal generation for the circuit of FIG. 2 with an untouched sensor.

In operation, and with reference to the "Y-up" channel, a clock pulse, as shown by the waveform 166 of FIG. 4, is generated on the line 80 and applied to the 555 timer 46. Synchronized with the leading edge of the clock pulse 166 is the leading edge of an output disable pulse 168 generated on the line 108 applied to the AND gate 158. Also synchronized with the leading edge of the pulse 166 is a pulse train 170 at the output of the one-shot 134 on the line 130. During the pulse width of the clock pulse 166 and when the variable capacitor 12 is in an untouched condition, the output of the 555 timer 46, as applied to the J-K flip-flop 154, is illustrated by the waveform 172.

In the time interval of the clock pulse 166, the timer 46 is enabled at the leading edge of the clock pulse. The leading edge of the output disable pulse 168 on the line 108 disables the AND gate 158 and the output thereof remains at a logic zero level which disables the NAND gate 162. Synchronized with the leading edge of the clock pulse 168 is the leading edge of the first pulse output from the timer 46. This pulse is applied to the J-K flip-flop 154 which generates a logic high signal at the Q-terminal to the AND gate 158. However, the AND gate 158 is disabled and in turn disables the NAND gate 162. Thus, the pulse train oscillator pulses 170 on the line 130 as applied to the NAND gate 162 are blocked from transmission to the output line 36. This is the result of disabling the NAND gate 162 by the logic zero level output from the AND gate 158.

At the trailing edge of the first pulse from the timer 46, the J-K flip-flop 154 is toggled and the Q-terminal output switches to a logic zero level. This J-K flip-flop 154 cannot subsequently be toggled to the alternate steady state and subsequent pulses from the timer 46 do not change the logic level at the Q-terminal. Thus, for the remainder of the clock pulse 166 the Q-terminal output of the flip-flop 154 remains at the logic zero level.

At the trailing edge of the output disable pulse 168 on the line 108 the AND gate 158 is enabled; however, at this time the Q-terminal of the flip-flop 154 is at the logic zero level and remains there for the duration of the clock pulse 166. The output of the AND gate 158 will thus be held at the logic zero level for the remainder of the clock pulse 166, thereby also disabling the NAND gate 162. The pulse train oscillator pulses on the line 130 are blocked from transmission to the output line 36. This produces no output pulses on the line 36 as illustrated by the waveform 173 of FIG. 4.

Subsequently, the clock pulse 166 terminates thereby resetting the timer 46 and shutting down this oscillator. While not shown at FIG. 4, at the trailing edge of the clock pulse 166 a clock pulse is generated on the line 86 to clear the J-K flip-flop 154 for response to the next output pulse from the timer 46.

So long as the first pulse from the timer 46 in the waveform 172 has a time interval less than the output disable pulse 168, the output at the NAND gate 162 remains at the logic one level. This condition exists so long as the variable capacitor 12 is untouched.

Figure 5:
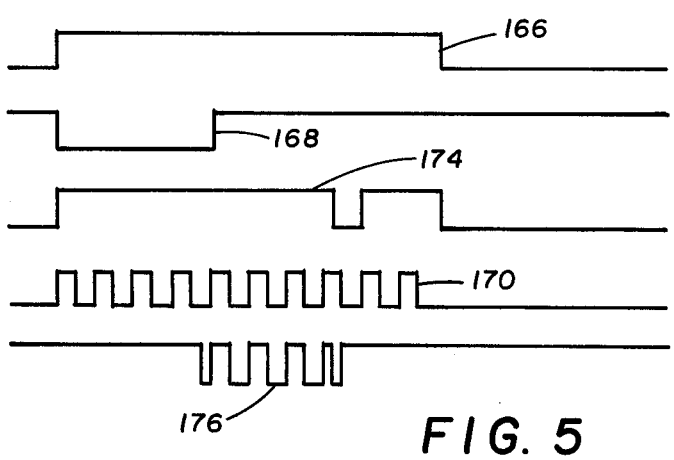
FIG. 5 is a series of waveforms illustrating the pulse train generation at an output terminal of one of the channels of the circuit of FIG. 2 connected to a touched sensor.

Referring to FIG. 5, assuming now that a human touch occurs on the finger 12a. At the rising edge of the clock pulse 166 a synchronized output disable pulse 168 is generated on the line 108 to the AND gate 158. Again, the pulse train oscillator is enabled to generate the pulse train 170 on the line 130 to the NAND gate 162.

When a touch condition exists on finger 12a, the output frequency of the 555 timer 46 decreases thereby increasing the width interval of each output pulse applied to the J-K flip-flop 154. The pulse waveform 174 illustrates a typical output from the timer 46 with a touch occurring on the finger 12a. With this pulse applied to the J-K flip 154 the Q-terminal toggles to a logic one level which is applied to the AND gate 158. During the interval of the output disable pulse 168, this output from the J-K flip-flop 154 is blocked and the output of the AND gate 158 is at a logic zero level.

At the trailing edge of the output disable pulse 168 both inputs to AND gate 158 are at a logic one level thereby creating a clock window by generating a logic one to the NAND gate 162. When the output of the AND gate 158 is at a logic one level each time a pulse appears on the line 130 both inputs to the NAND gate 162 are at a logic one level. This then produces a logic zero on the output line 36. The output on the line 36 will now be a series of pulses at the frequency of the signal on line 130 as illustrated by the waveform 176. The number of pulses 176 generated on the output line 36 varies with the width of the clock window as established between the trailing edge of the output disable pulse 168 and the trailing edge of the timer pulse 174.

At the trailing edge of the pulse 174 the J-K flip-flop 154 is toggled to the second steady state, thereby switching the Q-terminal to the logic zero level. As explained previously, this flip-flop cannot again be toggled by the output of the timer 46 and the Q-terminal output is locked at the logic zero level for the duration of the clock pulse 166. This drives the output of the AND gate 158 to a logic zero level, thereby blocking the pulses 170 at the NAND gate 162. Thus, the next output pulse from the timer 46 does not again reestablish a condition for clocking the pulses 170 to the output line 36.

It will thus be seen that the number of pulses 176 generated on that output line 36 depends on the time interval between the trailing edge of the pulse 168 and the trailing edge of the pulse 174 when occurring later in time. This time interval is directly related to the capacitance of the electrode 12. The greater number of pulses 176 generated on the output line 36 is the control factor for determining the speed of movement of the cursor across a cathode ray tube display.

Each of the other three channels of the circuit of FIG. 2 operates as described above with reference to the channel of the electrode 12. Thus, the output pulses 176 may be generated on any of the output lines 36–39 depending on which electrode is responding to a touch condition. The direction of cursor movement is determined by which of the NAND gates 162–165 couples the pulse train 176 to the output lines 36–39.

Referring to FIGS. 6–9, there is illustrated the output waveforms on each of the lines 36–39 for various touch positions of the transducer 10. When an operator touches the finger electrode 12a the channel of the variable capacitor 12 functions in the manner described with reference to FIG. 5 to generate a pulse train 178 on the output line 36. Each of the other output lines 37–39 remains at a logic one level as illustrated by the waveforms 179–181. This sequence of voltages is input to a cursor drive circuit, typically up/down counters, that drives the display cursor rapidly up along the positive Y-axis of the cathode ray tube.

Next, assuming an operator touches the sections 12c and 13c thereby changing the capacitance of the variable capacitors 12 and 13 as connected to the timers 46 and 56, respectively. Each of the channels of these two timers functions in the manner as described with reference to FIG. 5 producing the output pulses 182 and 184 on the lines 36 and 38. While the channels of the variable capacitors 12 and 13 generate the output waveforms 182 and 184, the channels of the variable capacitors 14 and 15 function in the manner as described with reference to FIG. 4. That is, the NAND gates 163 and 165 are in a disable condition to block the pulse train oscillator output on the line 132 to the output lines 37 and 39. This results in the waveforms 183 and 185 being generated on the output lines 37 and 39, respectively.

When an operator touches the sections 14c and 15c, the channels of the variable capacitors 14 and 15, including the oscillators 66 and 76, respectively, function to generate the output pulses of the waveforms 187 and 189 on the output lines 37 and 39. Under these conditions, the channels of the variable capacitors 12 and 13 generate the waveforms 186 and 188, that is, no pulse train is generated on these output lines with a touch of the sections 14c and 15c. The cursor electronics responding to the output waveforms 186–189 drives the cursor display down and to the left on the CRT.

With reference to FIG. 9, there is shown the output waveforms of the lines 36–39 with a human touch at the wide area of the pattern for the electrode 12 where the sections 12b and 12c join the finger 12a. The output waveform 174, as generated at the 555 timer 46, produces a longer clock window than for the conditions of FIG. 6, and more output pulses are generated on the output line 36 as indicated by comparison of the waveform 178 with the waveform 190. This condition causes the cursor display to move upward on the cathode ray tube; however, the cursor will move rapidly upward across the CRT. Thus, the number of pulses in each of the waveforms of FIGS. 6–9 is an indication not only of the direction of the cursor movement, but also the speed at which the cursor moves.

When the electrode 12 is touched, as described previously with regard to FIG. 9, the output lines 37–39 do not carry output pulses as indicated by the waveforms 191–193. A human touch on each of the wide areas of the electrodes 13–15 will similarily produce a limited number of output pulses as given by the waveform 190 on the respective output lines 37–39.

While only one embodiment of the invention is shown and described herein, it will be evident to those skilled in the art that numerous modifications and alterations may be made thereto without departing from the spirit and scope of the invention as set forth in the appended claims.

What is claimed is:

1. A capacitive activated transducer, comprising:
 a sensor responsive to a touch by a human operator to generate a change in capacitance,
 an oscillator connected to said sensor and generating a signal at a frequency varying with the capacitance of said sensor, and
 means for gating a pulse train signal to an output terminal, said means connected to said oscillator and responsive to a time window varying with the frequency of said oscillator.

2. A capacitive activated transducer as set forth in claim 1 wherein said oscillator includes an integrated circuit generating pulse signals at a repetition rate related to the capacitance of said sensor.

3. A capacitive activated transducer as set forth in claim 2 wherein said gating means is responsive to the output of said integrated circuit and to enabling pulses.

4. A capacitive activated transducer as set forth in claim 1 wherein said sensor includes a substrate of an electrically insulating material with an etched copper pattern overlaying said substrate connected to said oscillator and responsive to a touch by a human operator.

5. A capacitive activated transducer, comprising:
 a sensor having a plurality of electrodes, each responsive to a touch by a human operator to generate a change in capacitance at each electrode, and
 a plurality of oscillators equal in number to said plurality of electrodes, each oscillator connected to one of said electrodes and generating a signal at a frequency related to the capacitance of said electrode, and
 timing and control means connected to said plurality of oscillators for gating a pulse train signal to an output terminal for a preset time window varying with the frequency signal from said oscillators.

6. A capacitive activated transducer as set forth in claim 5 wherein each of said oscillators includes an integrated logic circuit generating pulse signals at a repetition rate related to the capacitance of the electrode connected thereto.

7. A capacitive activated transducer as set forth in claim 5 wherein said sensor consists of two pairs of opposed electrodes oriented along orthogonal axes.

8. A capacitive activated transducer as set forth in claim 7 including a finger electrode extending inward from each of said electrodes toward the intersection of the orthogonal axes.

9. A capacitive activated transducer as set forth in claim 5 wherein said sensor includes a substrate of an electrically insulating material with the electrodes consisting of a copper pattern on said substrate.

10. A capacitive activated transducer as set forth in claim 9 including a protective shield overlaying said copper electrodes.

11. A sensor for a capacitive activated transducer, comprising:
 a first pair of opposed electrodes positioned along a first of two orthogonal axes and spaced an equal and predetermined distance from the intersection of said orthogonal axes, each electrode of said first pair having a shape symmetrical with said first orthogonal axis, and
 a second pair of opposed electrodes positioned along the second of said two orthogonal axes and spaced an equal and predetermined distance from the intersection of said orthogonal axes, each electrode of said second pair having a shape symmetrical with said second orthogonal axis and positioned with respect to the adjacent electrodes of said first pair such that a predetermined portion of the periphery of said electrode is spaced a predetermined distance from a corresponding portion of said adjacent electrodes,
 whereby a change in capacitance may be sensed with respect to the two orthogonal axes when the sensor is touched by a human operator.

12. A sensor for a capacitive activated transducer as set forth in claim 11 wherein said first and second pairs of electrodes have a shape whose outer peripheries form a ring-shaped configuration.

13. A sensor for a capacitive activated transducer as set forth in claim 12 wherein the radius of the outer edge of the ring-shaped configuration is substantially constant.

14. A sensor for a capacitive activated transducer as set forth in claim 11 including a finger electrode extending toward the intersection of said orthogonal axes from each of said electrodes.

15. A sensor for a capacitive activated transducer as set forth in claim 14 wherein each finger electrode is oriented along one of the two orthogonal axes.

16. A sensor for a capacitive activated transducer, comprising:
 a substrate of an electrically insulating material,
 a first pair of opposed electrodes formed on said substrate along a first of two orthogonal axes and spaced an equal and predetermined distance from the intersection of said orthogonal axes, each electrode of said first pair having a shape symmetrical with said first orthogonal axis, and
 a second pair of opposed electrodes formed on said substrate along the second of said two orthogonal axes and spaced an equal and predetermined distance from the intersection of said orthogonal axes, each electrode of said second pair having a shape symmetrical with said second orthogonal axis and positioned with respect to the adjacent electrodes of said first pair such that a predetermined portion of the periphery of said electrode is spaced a predetermined distance from a corresponding portion of said adjacent electrodes, whereby a change in capacitance may be sensed with respect to the two orthogonal axes when the sensor is touched by a human operator.

17. A sensor for a capacitive activated transducer as set forth in claim 16 wherein said electrodes comprise an etched copper pattern overlaying said substrate.

18. A sensor for a capacitive activated transducer as set forth in claim 17 including a protective shield overlaying said copper pattern.

19. A sensor for a capacitive activated transducer as set forth in claim 17 wherein said first and second pairs of copper electrodes have a shape whose outer peripheries form a ring-shaped configuration.

* * * * *